(12) United States Patent
Lee et al.

(10) Patent No.: US 10,727,229 B2
(45) Date of Patent: Jul. 28, 2020

(54) STRUCTURE AND METHOD FOR SEMICONDUCTOR DEVICE

(71) Applicant: Taiwan Semiconductor Manufacturing Co., Ltd., Hsin-Chu (TW)

(72) Inventors: Yi-Jing Lee, Hsinchu (TW); Tsz-Mei Kwok, Hsinchu (TW); Ming-Hua Yu, Hsinchu (TW)

(73) Assignee: TAIWAN SEMICONDUCTOR MANUFACTURING CO., LTD., Hsin-Chu (TW)

(*) Notice: Subject to any disclaimer, the term of this patent is extended or adjusted under 35 U.S.C. 154(b) by 62 days.

(21) Appl. No.: 15/816,386

(22) Filed: Nov. 17, 2017

(65) Prior Publication Data
US 2018/0076203 A1    Mar. 15, 2018

Related U.S. Application Data

(62) Division of application No. 15/051,072, filed on Feb. 23, 2016, now Pat. No. 9,825,036.

(51) Int. Cl.
| H01L 29/66 | (2006.01) |
| H01L 29/165 | (2006.01) |
| H01L 29/06 | (2006.01) |
| H01L 29/08 | (2006.01) |
| H01L 27/092 | (2006.01) |

(Continued)

(52) U.S. Cl.
CPC .... *H01L 27/0924* (2013.01); *H01L 21/30604* (2013.01); *H01L 21/31111* (2013.01); *H01L 21/823814* (2013.01); *H01L 21/823821* (2013.01); *H01L 29/0649* (2013.01); *H01L 29/0847* (2013.01); *H01L 29/165* (2013.01);
(Continued)

(58) Field of Classification Search
CPC combination set(s) only.
See application file for complete search history.

(56) References Cited

U.S. PATENT DOCUMENTS

| 7,667,271 B2 | 2/2010 | Yu et al. |
| 8,362,575 B2 | 1/2013 | Kwok et al. |
| (Continued) |

FOREIGN PATENT DOCUMENTS

| CN | 103187445 | 7/2013 |
| TW | 200843109 | 11/2008 |
| (Continued) |

*Primary Examiner* — Moazzam Hossain
(74) *Attorney, Agent, or Firm* — Haynes and Boone, LLP (57) ABSTRACT

A semiconductor device includes a substrate; an isolation structure over the substrate; and two fins in a first region of the semiconductor device extending from the substrate and through the isolation structure. Each of the two fins has a channel region and two source/drain (S/D) regions sandwiching the channel region. The semiconductor device further includes a gate stack over the isolation structure and engaging the channel regions of the two fins; and four S/D features over the S/D regions of the two fins. Each of the four S/D features includes a lower portion and an upper portion over the lower portion. Each of the lower portions of the four S/D features has a cross-sectional profile that is wider at its bottom than at its top. The upper portions of the four S/D features merge into two merged S/D features with one on each side of the gate stack.

20 Claims, 10 Drawing Sheets (51) Int. Cl.
  *H01L 21/306* (2006.01)
  *H01L 21/311* (2006.01)
  *H01L 21/8238* (2006.01)

(52) U.S. Cl.
  CPC .. *H01L 29/66545* (2013.01); *H01L 29/66636* (2013.01)

(56) References Cited

U.S. PATENT DOCUMENTS

| | | |
|---|---|---|
| 8,367,498 B2 | 2/2013 | Chang et al. |
| 8,440,517 B2 | 5/2013 | Lin et al. |
| 8,497,528 B2 | 7/2013 | Lee et al. |
| 8,610,240 B2 | 12/2013 | Lee et al. |
| 8,680,576 B2 | 3/2014 | Ching et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,785,285 B2 | 7/2014 | Tsai et al. |
| 8,796,759 B2 | 8/2014 | Perng et al. |
| 8,809,139 B2 | 8/2014 | Huang et al. |
| 8,828,823 B2 | 9/2014 | Liu et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 9,553,194 B1 | 1/2017 | Licausi et al. |
| 2008/0014699 A1 | 1/2008 | Torek et al. |
| 2011/0068407 A1 | 3/2011 | Yeh et al. |
| 2012/0074464 A1 | 3/2012 | Cea et al. |
| 2013/0011983 A1 | 1/2013 | Tsai et al. |
| 2013/0221447 A1* | 8/2013 | Lee ............... H01L 27/092 257/369 |
| 2014/0203338 A1* | 7/2014 | Kelly ............... H01L 29/785 257/288 |
| 2014/0252412 A1 | 9/2014 | Tsai et al. |
| 2014/0284719 A1 | 9/2014 | Khakifirooz et al. |
| 2015/0214366 A1 | 7/2015 | Chang et al. |
| 2015/0255569 A1 | 9/2015 | Kim et al. |
| 2015/0255576 A1 | 9/2015 | Liao et al. |
| 2015/0287810 A1 | 10/2015 | Kerber et al. |
| 2016/0118500 A1 | 4/2016 | Wu et al. |
| 2016/0268171 A1 | 9/2016 | Wei et al. |
| 2016/0315172 A1 | 10/2016 | Wu et al. |
| 2017/0229310 A1* | 8/2017 | Fung ............... H01L 21/3065 |
| 2017/0243868 A1 | 8/2017 | Lee et al. |
| 2018/0337235 A1* | 11/2018 | Rachmady ........... H01L 29/78 |
| 2019/0058053 A1* | 2/2019 | Dewey ............... H01L 29/775 |

FOREIGN PATENT DOCUMENTS

| | | |
|---|---|---|
| TW | 201407786 | 2/2014 |
| TW | 201541638 | 11/2015 |

* cited by examiner

STRUCTURE AND METHOD FOR SEMICONDUCTOR DEVICE

PRIORITY

This is a divisional of U.S. patent application Ser. No. 15/051,072, filed Feb. 23, 2016, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as semiconductor devices, such as metal-oxide-semiconductor field effect transistors (MOSFETs), are scaled down through various technology nodes, strained source/drain (S/D) features have been implemented to enhance carrier mobility and improve device performance. One approach of forming a MOSFET with strained S/D features grows epitaxial silicon (Si) to form raised S/D features for an n-type device, and grows epitaxial silicon germanium (SiGe) to form raised S/D features for a p-type device. Various techniques directed at shapes, configurations, and materials of these S/D features have been implemented to further improve transistor device performance. Although existing approaches have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and methods of forming the same. In particular, the present disclosure is related to forming raised S/D features in field effect transistors (FETs) including fin-like FETs (FinFETs). In one aspect of the present disclosure, two or more raised S/D features merge into a larger S/D feature having a curvy (or non-flat) top surface. The curvy top surface provides a greater surface area for S/D contact formation than a flat top surface provides. Furthermore, the raised S/D features are surrounded by a dielectric layer (or film) at their respective bottom portions. The dielectric layer protects the raised S/D features from potential contamination by metal materials in replacement gate processes.

Figure 1:
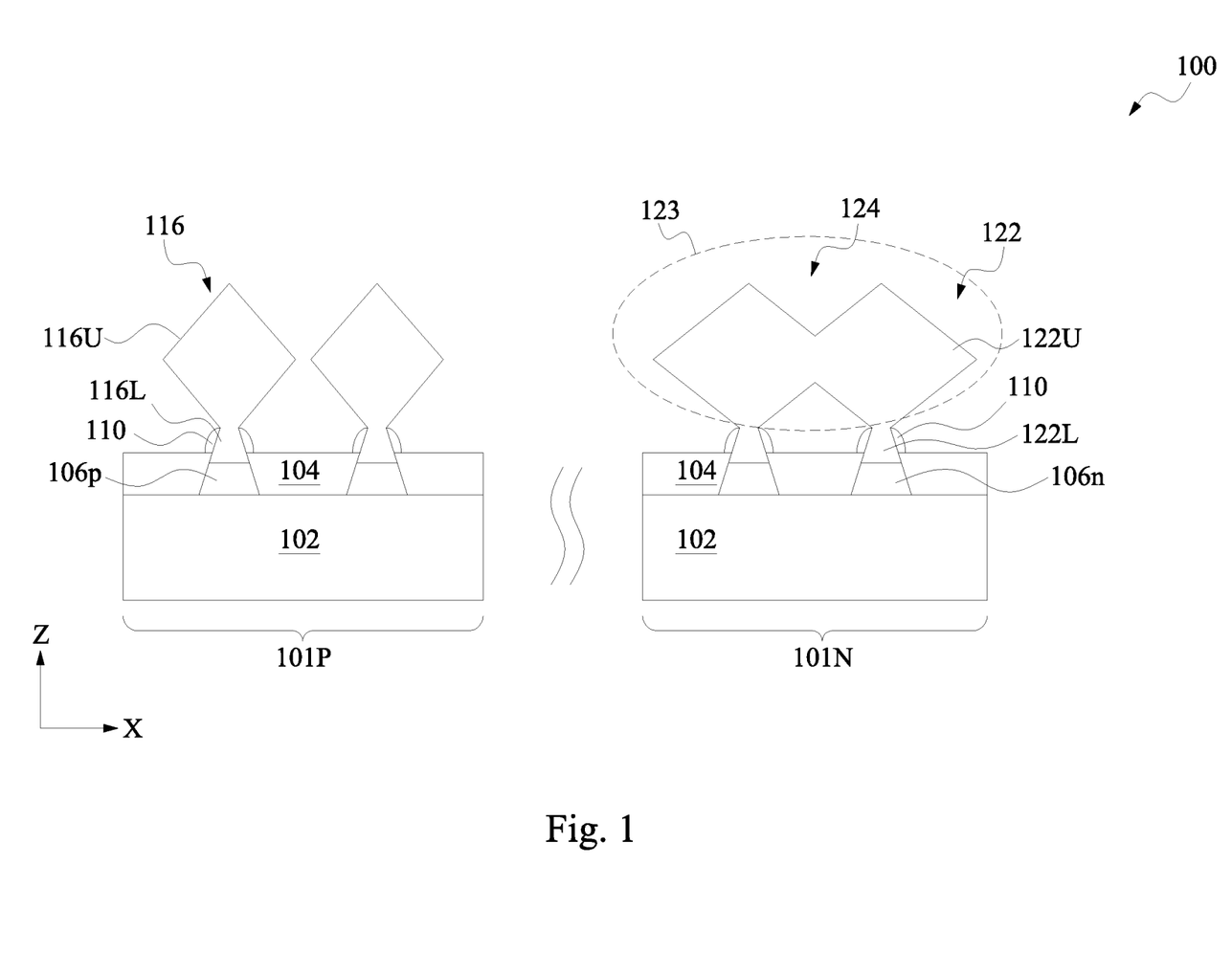
FIG. 1 illustrate a semiconductor device constructed according to various aspects of the present disclosure.

FIG. 1 shows a semiconductor device 100 constructed according to various aspects of the present disclosure. The semiconductor device 100 may be an intermediate device fabricated during processing of an IC, or a portion thereof, that may comprise static random access memory (SRAM) and/or logic circuits, passive components such as resistors, capacitors, and inductors, and active components such as PFETs, NFETs, FinFETs, MOSFET, CMOS transistors, bipolar transistors, high voltage transistors, high frequency transistors, other memory cells, and combinations thereof.

Referring to FIG. 1, the semiconductor device 100 includes various device regions. Particularly, it includes a P-type device region 101P and an N-type device region 101N. The device region 101P is properly configured for forming PFETs, and the device region 101N is properly configured for forming NFETs. The various device regions are formed in, and on, a common substrate 102. An isolation structure 104 is disposed over the substrate 102. Various fins extend from the substrate 102 and through the isolation structure 104. The various fins include two P-type fins 106*p* for forming PFETs and two N-type fins 106*n* for forming NFETs. Although not shown in FIG. 1, each of the fins 106*p* and 106*n* includes a channel region and two S/D regions sandwiching the channel region. FIG. 1 shows a sectional view of the device 100 cut across the S/D regions.

Still referring to FIG. 1, the semiconductor device 100 further includes raised S/D features 116 and 122 over the S/D regions of the fins 106p and 106n respectively. In an embodiment, the S/D features 116 include p-type doped silicon germanium, and the S/D features 122 include n-type doped silicon. Each of the S/D features 116 includes an upper portion 116U and a lower portion 116L. Each of the S/D features 122 includes an upper portion 122U and a lower portion 122L. In this embodiment, the lower portions 116L and 122L are partially in, and partially above, the isolation structure 104. The upper portions 116U and 122U have larger areas than the respective lower portions 116L and 122L from a top view for providing reduced S/D contact resistance. The upper portions 116U are separate from each other in this embodiment. The upper portions 122U merge into a large S/D feature 123 having a curvy top surface 124. The curvy top surface 124 has a dip near its center in this cross-sectional view. The curvy top surface 124 provides a large contact area for further reducing S/D contact resistance when an S/D contact is conformally deposited over the S/D feature 123.

Still referring to FIG. 1, the semiconductor device 100 further includes a dielectric layer 110 disposed over the isolation structure 104 and adjacent to the S/D regions of the fins 106p and 106n. The dielectric layer 110 surrounds the lower S/D portions 116L and 122L. In an embodiment, the semiconductor device 100 undergoes a replacement gate process after the formation of the S/D features 116 and 122. The replacement gate process may cause metal materials to leak into the space under the merged S/D feature 123. In such a case, the dielectric layer 110 protects the S/D features 122 from being contaminated by the metal materials. Furthermore, the height of the dielectric layer 110 may be used in tuning the height and size of the S/D features 116 and 122 in the fabrication process. In an embodiment, the dielectric layer 110 comprises a nitride such as silicon nitride, silicon oxynitride, or silicon carbon nitride.

Figure 2:
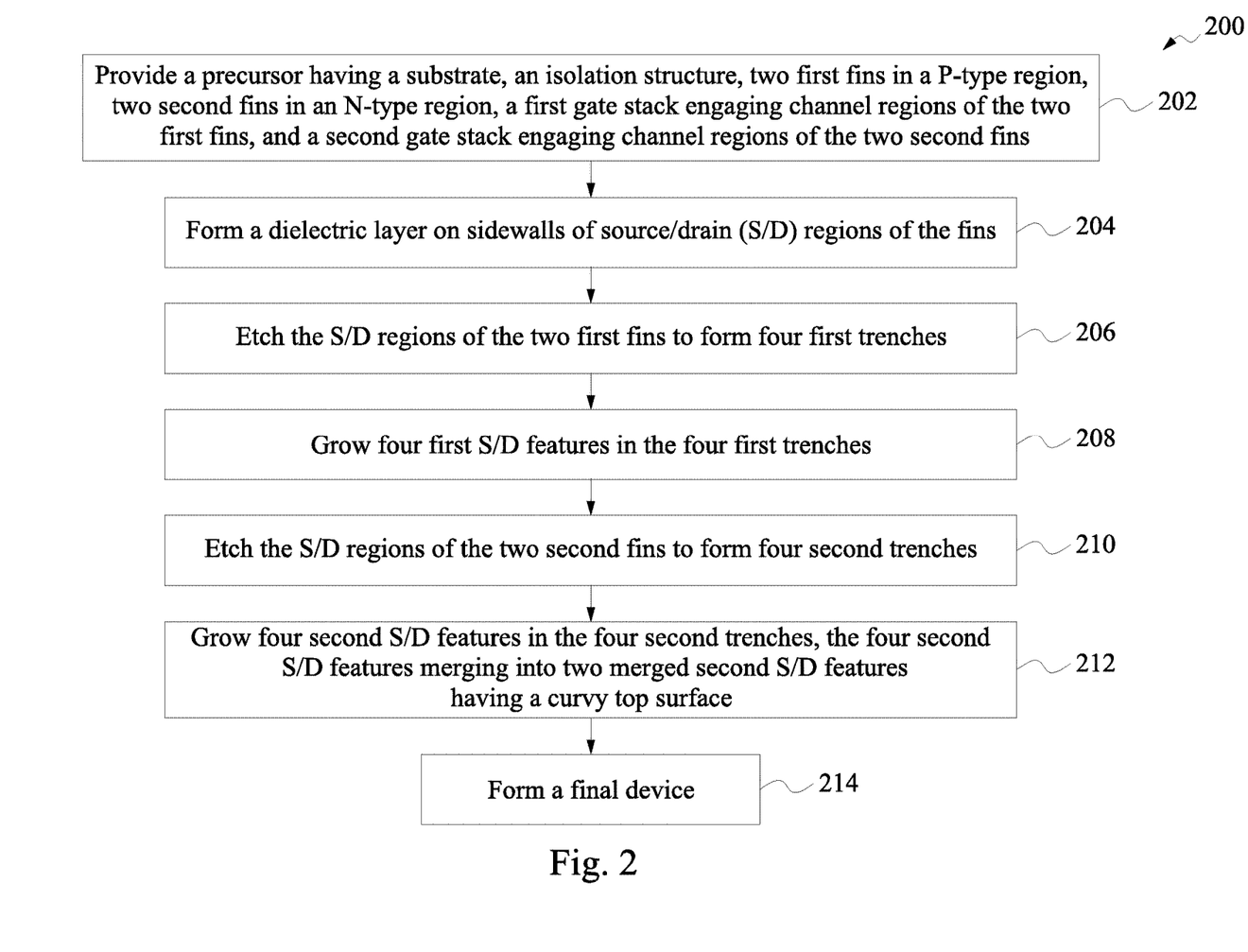
FIG. 2 shows a block diagram of a method of forming a semiconductor device, according to various aspects of the present disclosure.

FIG. 2 shows a block diagram of a method 200 of forming an embodiment of the semiconductor device 100, according to various aspects of the present disclosure. The method 200 is an example, and is not intended to limit the present disclosure beyond what is explicitly recited in the claims. Additional operations can be provided before, during, and after the method 200, and some operations described can be replaced, eliminated, or moved around for additional embodiments of the method. The method 200 is described below in conjunction with FIGS. 3-9 which are perspective and cross-sectional views of the semiconductor device 100, in accordance with some embodiments.

Figure 3:
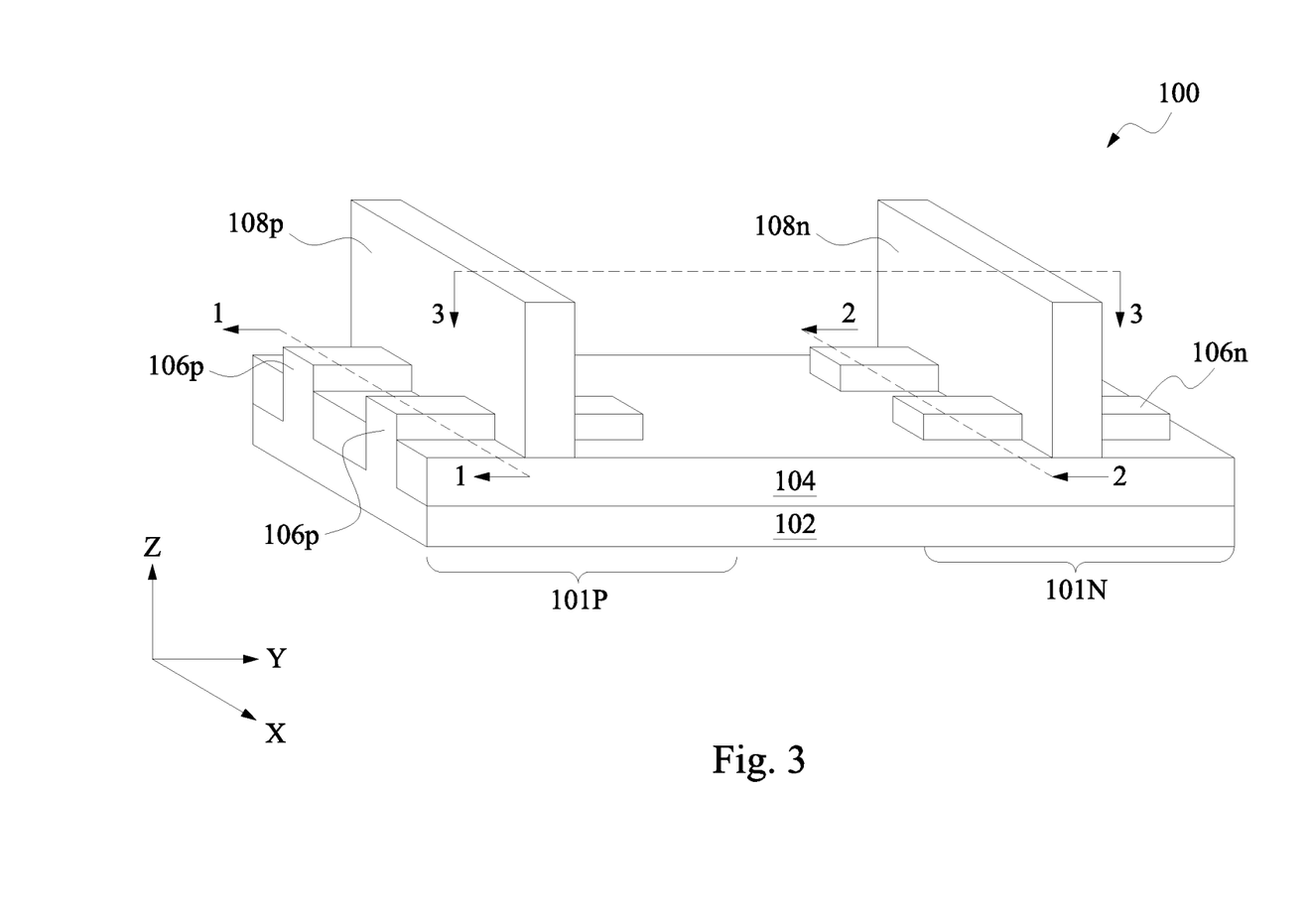
FIG. 3 illustrates a perspective view of a semiconductor device in an intermediate step of fabrication according to an embodiment of the method of FIG. 2.

At operation 202, the method 200 (FIG. 2) receives a precursor of the semiconductor device 100 (FIG. 3). For the convenience of discussion, the precursor of the semiconductor device 100 is also referred to as the semiconductor device 100, or simply the device 100. Referring to FIG. 3, the device 100 includes the substrate 102 with various structures formed therein and thereon. The substrate 102 is a silicon substrate in the present embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 includes a semiconductor-on-insulator (SOI) such as a buried dielectric layer. The substrate 102 includes active regions such as p-wells and n-wells for forming active devices.

Still referring to FIG. 3, the two fins (or protrusions) 106p extend from the substrate 102 in the P-type device region 101P, and the two fins 106n extend from the substrate 102 in the N-type device region 101N. The fins 106p and 106n are suitable for forming P-type and N-type FinFETs respectively. In the embodiment shown, each of the fins 106p and 106n is an elongated protrusion and is oriented lengthwise in the "y" direction. The two fins 106p are disposed side by side, and the two fins 106n are disposed side by side. The four fins 106p and 106n are isolated from each other by the isolation structure 104 that is disposed over the substrate 102.

The fins 106p and 106n may be fabricated using suitable processes including photolithography and etch processes. The photolithography process may include forming a photoresist layer (resist) overlying the substrate 102, exposing the resist to a pattern, performing post-exposure bake processes, and developing the resist to form a masking element including the resist. The masking element is then used for etching recesses into the substrate 102, leaving the fins 106p and 106n on the substrate 102. The etching process can include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. In an embodiment, the fins 106p and 106n may include epitaxial semiconductor layers.

The isolation structure 104 may be formed of silicon oxide, silicon nitride, silicon oxynitride, fluoride-doped silicate glass (FSG), a low-k dielectric material, and/or other suitable insulating material. In an embodiment, the isolation structure 104 is formed by etching trenches in the substrate 102 (e.g., as part of the fin formation process discussed above), filling the trenches with an isolating material, performing a chemical mechanical planarization (CMP) process, and recessing the isolating material to expose the fins 106p and 106n. Other isolation structure such as field oxide, LOCal Oxidation of Silicon (LOCOS), and/or other suitable structures are possible. The isolation structure 104 may include a multi-layer structure, for example, having one or more thermal oxide liner layers.

Still referring to FIG. 3, the device 100 further includes two gate stacks 108p and 108n disposed over the isolation structure 104. The gate stack 108p engages the fins 106p in the channel regions thereof and across the width thereof (along the "x" direction). As a result, the two S/D regions of the fins 106p are disposed on opposite sides of the gate stack 108p. Similarly, the gate stack 108n engages the fins 106n in channel regions thereof. The gate stacks 108p and 108n may each include a gate dielectric layer, a gate electrode layer, and one or more additional layers. In an embodiment, the gate stacks 108p and 108n are sacrificial gate structures (or dummy gates), i.e., placeholder for final gate stacks.

Figure 4:
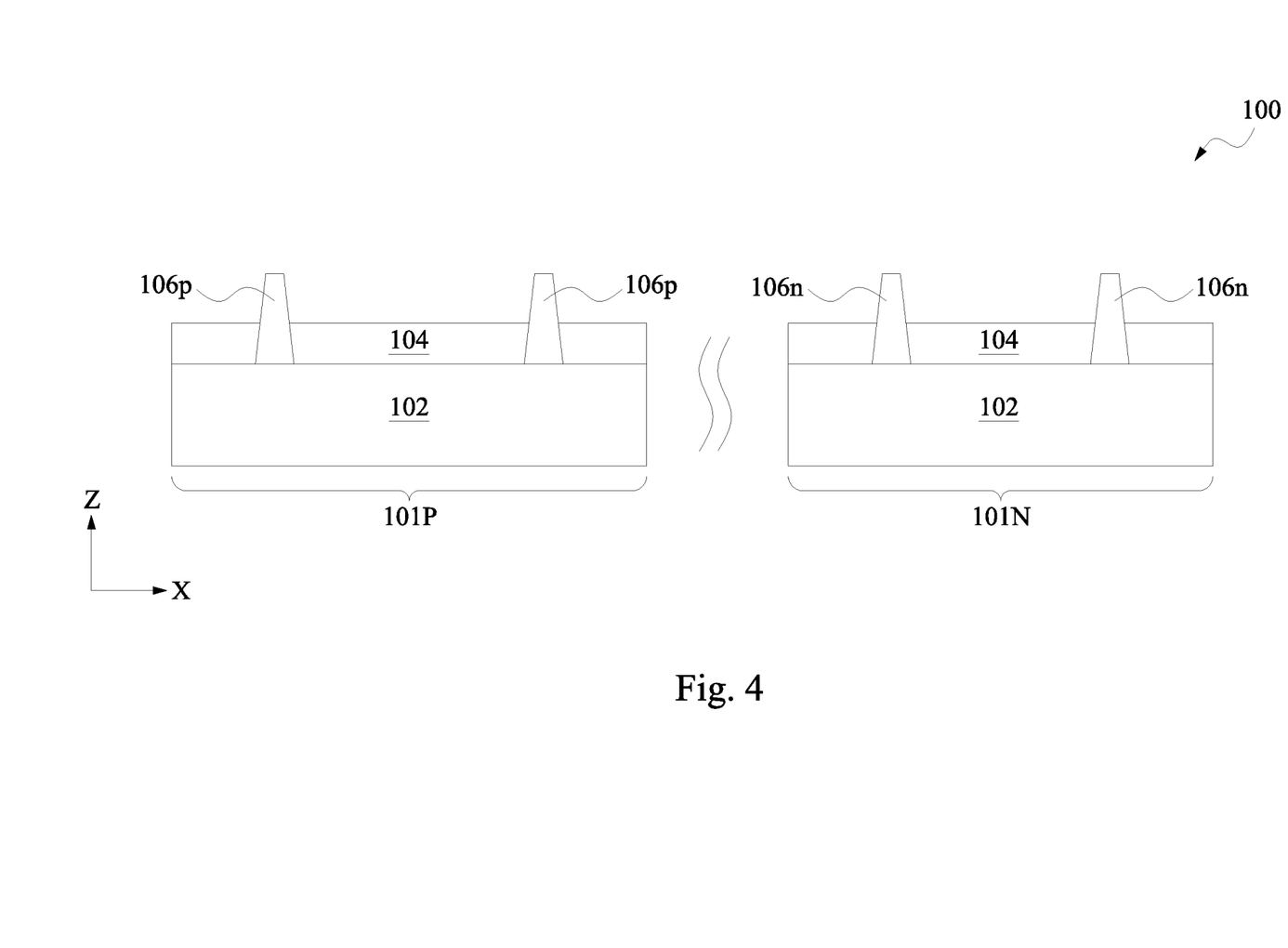
FIGS. 4, 5A, 5B, 6, 7, 8, and 9 illustrate cross-sectional views of forming a target semiconductor device according to the method of FIG. 2, in accordance with an embodiment.

FIG. 4 shows a cross-sectional view of the device 100, taken along the "1-1" and "2-2" lines of FIG. 3. Specifically, the "1-1" and "2-2" lines cut across one of the S/D regions of the fins 106p and 106n, respectively, in the "x-z" plane. Referring to FIG. 4, in the embodiment shown, each of the fins 106p and 106n has a cross-sectional profile tapered from its bottom portion (on the substrate 102) towards its top portion (away from the substrate 102). In the following discussion, FIGS. 5A, 6, 7, 8, and 9 illustrate the device 100 in the same cross-sectional view as FIG. 4.

Figure 5A:
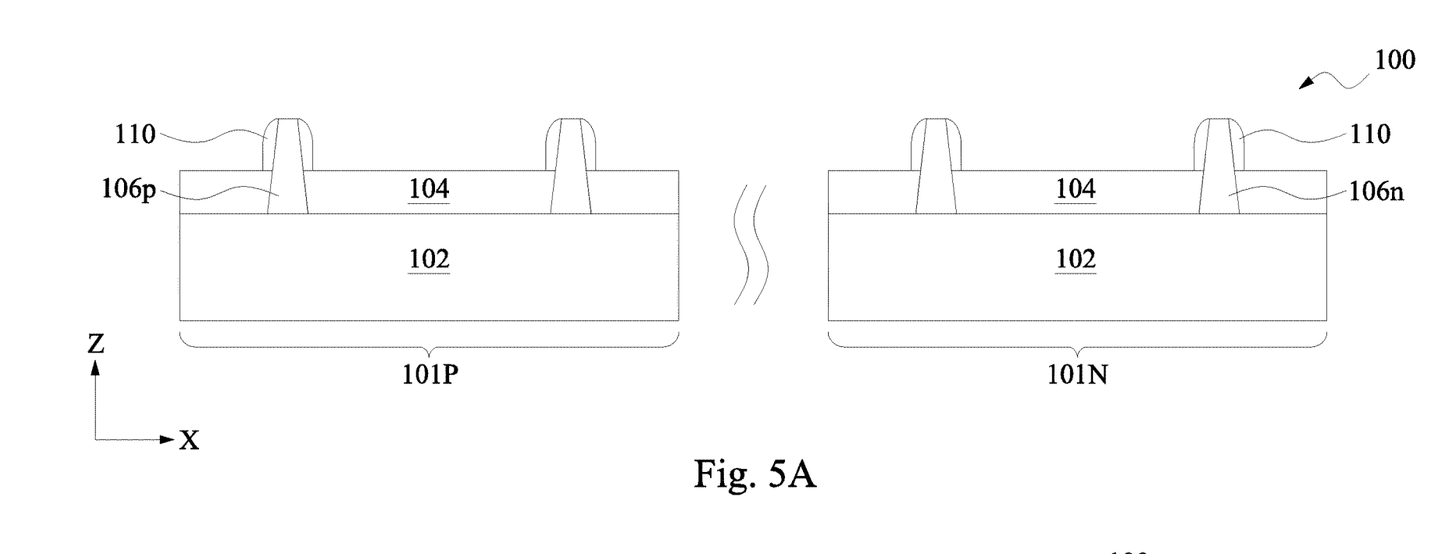
Figure 5B:
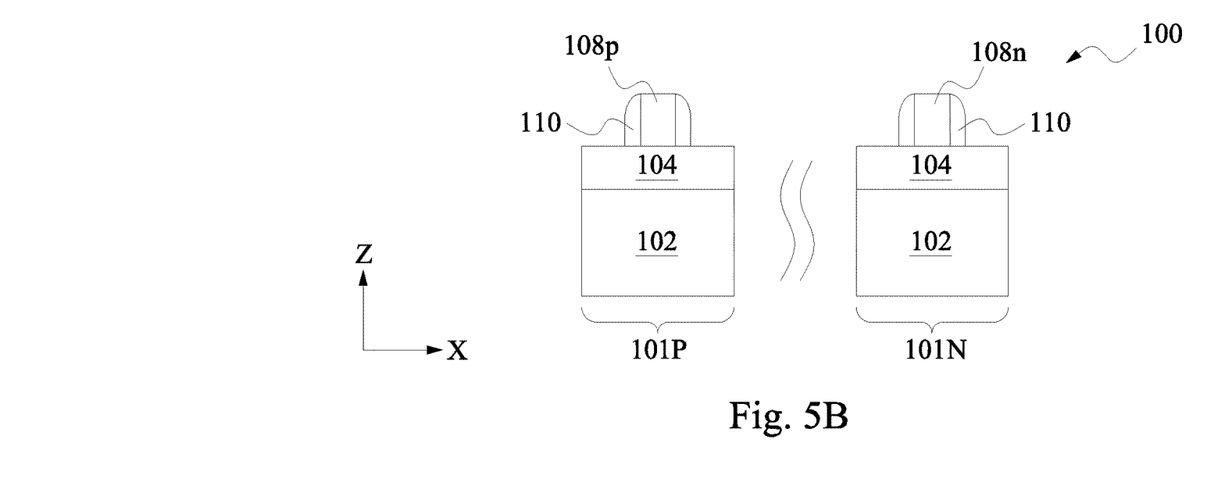

At operation 204, the method 200 (FIG. 2) forms the dielectric layer 110 on sidewalls of the fins 106p and 106n in the respective S/D regions. Referring to FIG. 5A, the dielectric layer 110 may comprise a single layer or multi-layer structure, and may comprise a dielectric material such as silicon nitride (SiN) or silicon oxynitride. The dielectric layer 110 may be formed by chemical vapor deposition (CVD), plasma-enhanced CVD (PECVD), atomic layer deposition (ALD), thermal deposition, or other suitable methods. In the present embodiment, the dielectric layer 110 is also disposed on sidewalls of the gate stacks 108p and 108n, as shown in FIG. 5B which shows a cross-sectional view of the device 100 taken along the "3-3" line of FIG. 3. In an embodiment, operation 204 includes a deposition process followed by an etching process. For example, it deposits a dielectric material over the device 100 as a blanket layer, covering the isolation structure 104, the fins 106p and 106n, and the gate stacks 108p and 108n. Then, it performs an anisotropic etching process to remove portions of the dielectric material from top surfaces of the isolation structure 104, the fins 106p and 106n, and the gate stacks 108p and 108n, leaving remaining portion of the dielectric material on sidewalls of the fins 106 and 106n and the gate stacks 108p and 108n as the dielectric layer 110.

Figure 6:
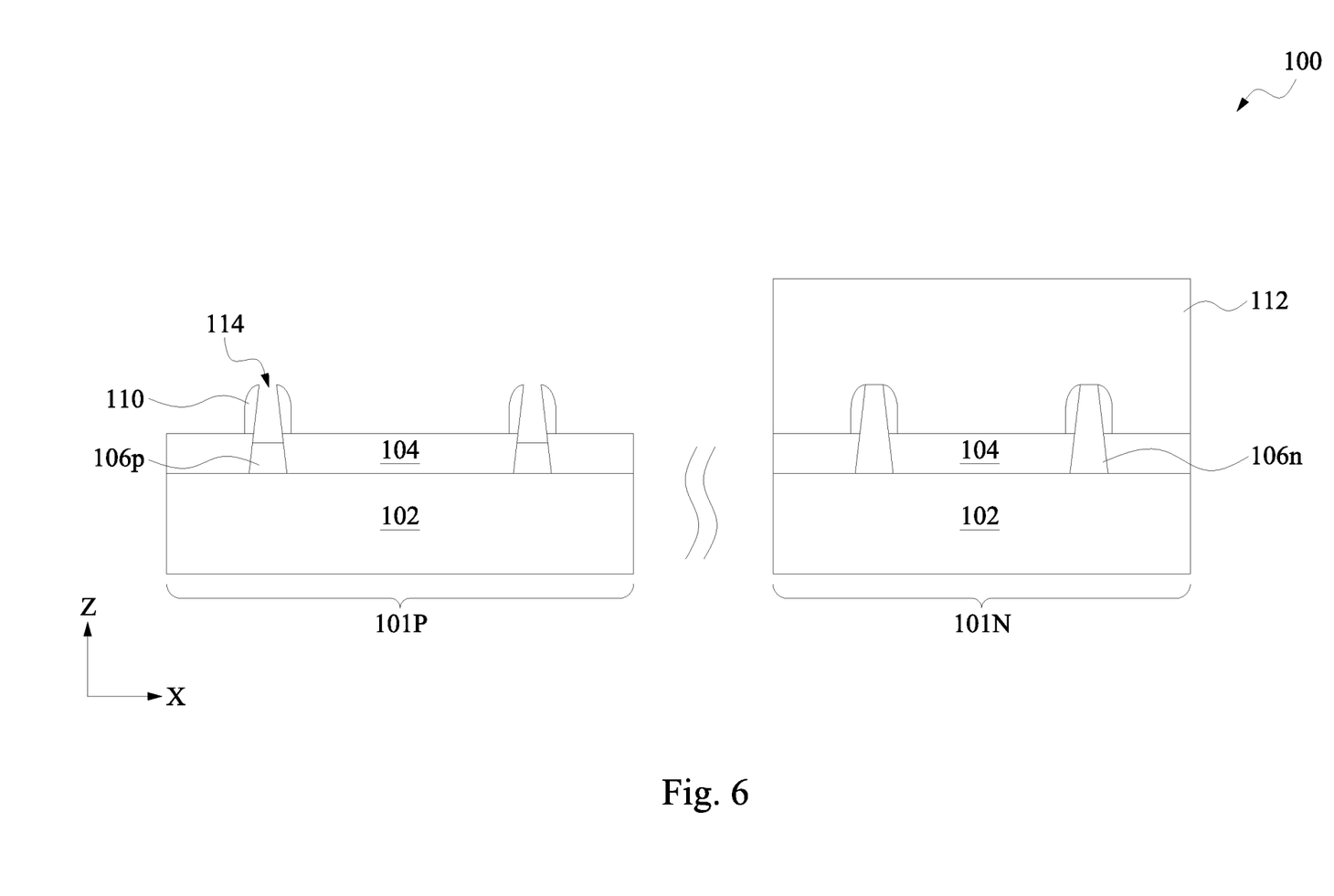

At operation 206, the method 200 (FIG. 2) selectively etches the S/D regions of the fins 106p to form trenches (or recesses) 114 therein. Referring to FIG. 6, the fins 106p are etched while the device region 101N is covered by a masking element 112. The masking element 112 may be formed by one or more photolithography process and etching process. The fins 106p may be etched by a dry etching process, a wet etching process, or other etching techniques. The etching process is selectively tuned to remove the materials of the fins 106p while the gate stack 108p, the dielectric layer 110, and the isolation structure 104 remain substantially unchanged. In the present embodiment, the S/D regions of the fins 106p are recessed to a level below the top surface of the isolation structure 104. The channel regions of the fins 106p, covered by the gate 108p (FIG. 3), are not etched by operation 206. Operation 206 forms four trenches 114 with two on each side of the gate stack 108p. Each trench 114 has a tapered cross-sectional profile (in the "x-z" plane) with a wider opening at its bottom than at its top. Although not shown, each trench 114 has a rectangular shape from a top view (in the "x-y" plane). After the etching process, a cleaning process may be performed that cleans the trenches 114 with a hydrofluoric acid (HF) solution, a diluted HF solution, or other suitable cleaning solutions.

Figure 7:
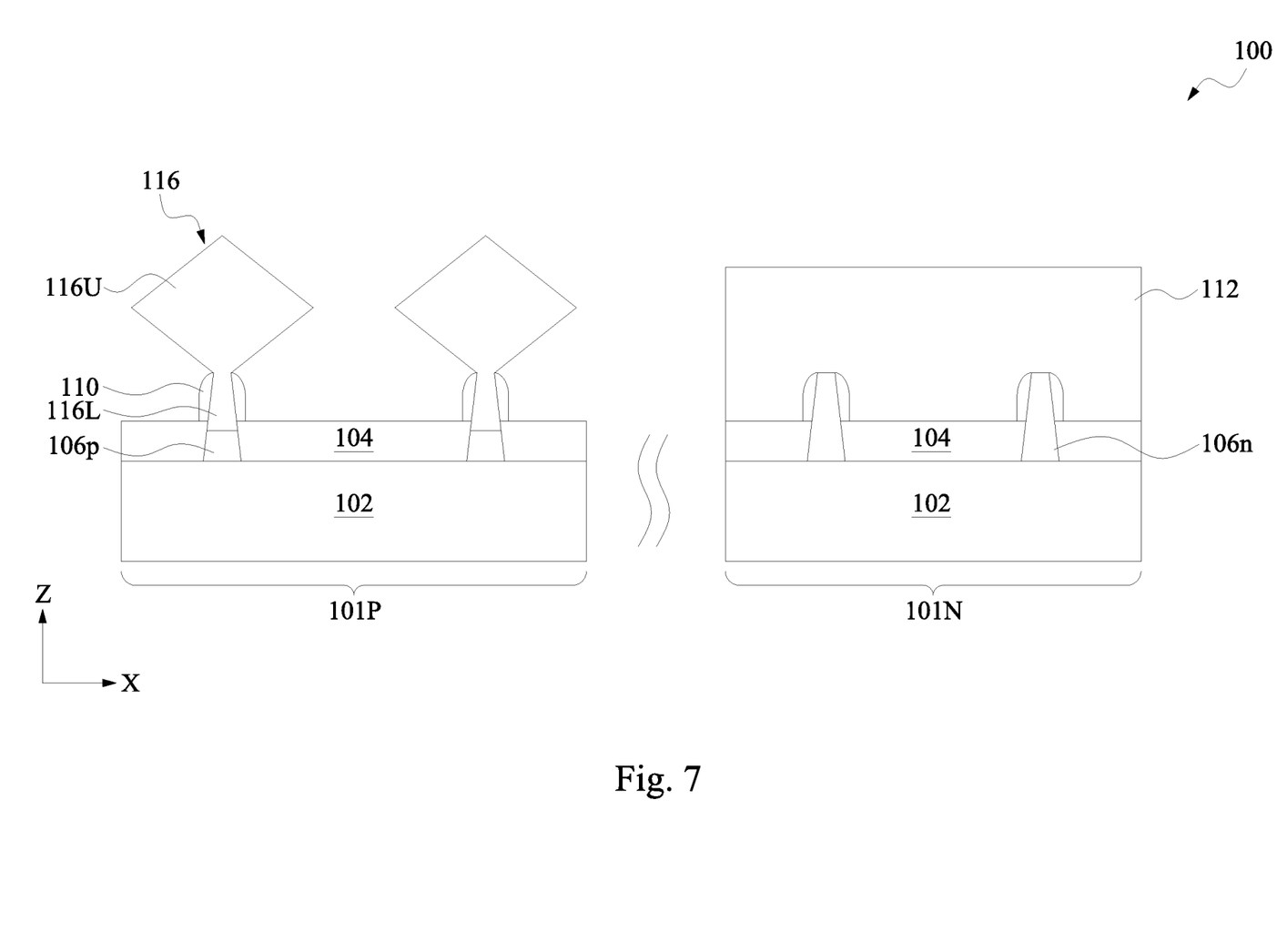

At operation 208, the method 200 (FIG. 2) grows four P-type doped S/D features 116 in the four trenches 114, with one in each trench. Referring to FIG. 7, the S/D feature 116 includes a lower portion 116L and an upper portion 116U over the lower portion 116L. The lower portion 116L fills the trench 114 and thereby conforms to the shape of the trench 114 (FIG. 6). The upper portion 116U is above the dielectric layer 110, and expands laterally and upwardly. In this embodiment, the upper portion 116U has a generally diamond shape in the "x-z" plane. The four S/D features 116U do not merge (i.e., they are separate from each other). In another embodiment, the two S/D features 116U on the same side of the gate stack 108 (FIG. 3) merge into one large S/D feature. Whether or not the S/D features 116 merge may be controlled by the spacing between the two trenches 114 (FIG. 6), the height of the dielectric layer 110, the crystalline facets of the S/D features 116, and the growth rate and growth time for the S/D features 116. In an embodiment, the S/D features 116 include silicon germanium (SiGe) formed by one or more epitaxial growth processes. The epitaxial growth process may be a low pressure chemical vapor deposition (LPCVD) process or a selective epitaxy growth (SEG) process. Furthermore, the one or more epitaxial growth processes may in-situ dope the grown SiGe with a P-type dopant such as boron or indium for forming doped SiGe features for P-type devices.

Figure 8:
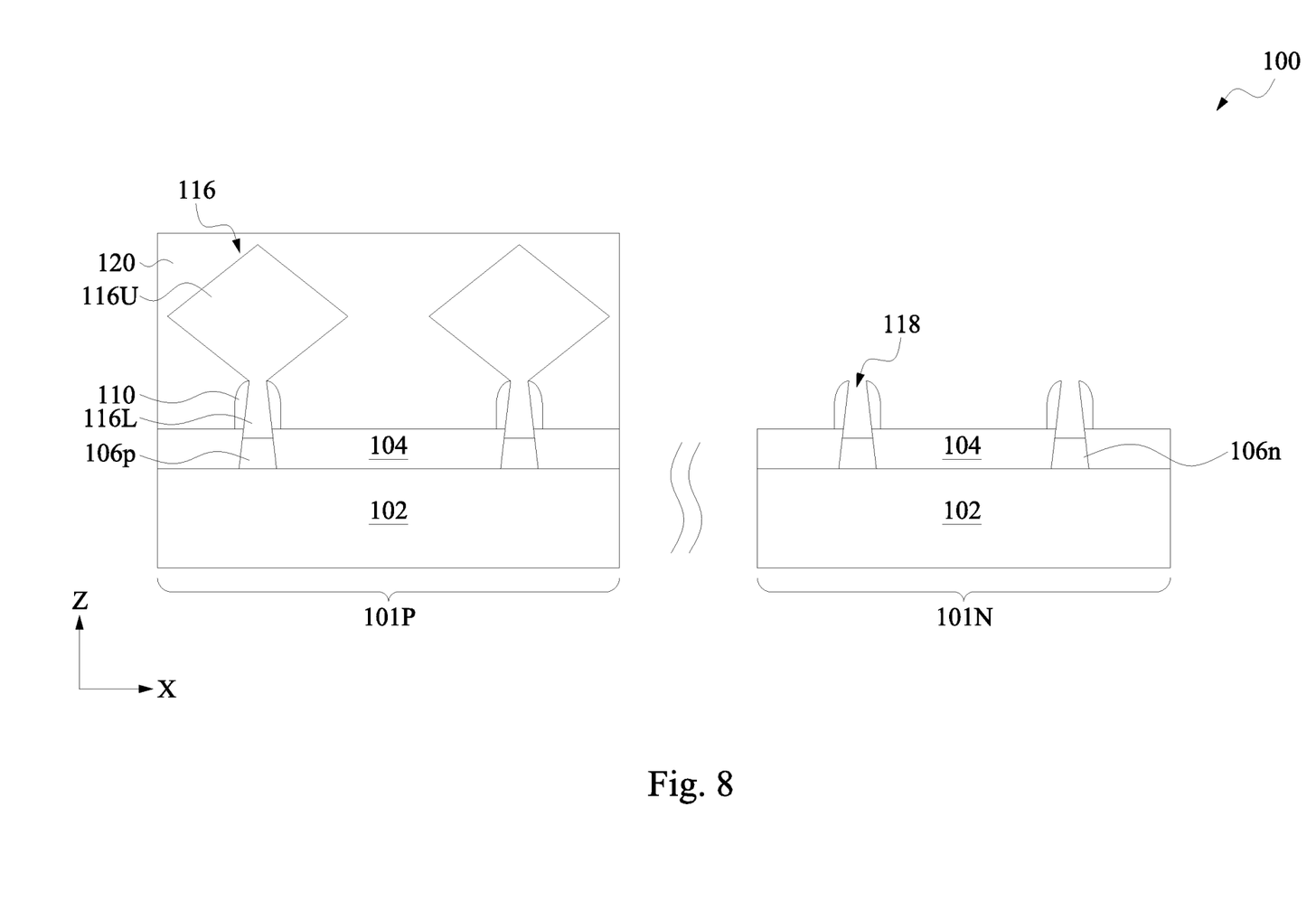

At operation 210, the method 200 (FIG. 2) selectively etches the S/D regions of the fins 106n to form trenches (or recesses) 118 therein. Referring to FIG. 8, the masking element 112 is removed from the device region 101N. Another masking element 120 is formed over the device region 101P, covering various features thereon. Thereafter, the fins 106n are etched using an etching process selectively tuned to remove the materials of the fins 106n while the gate stack 108n (FIG. 3), the dielectric layer 110, and the isolation structure 104 remain substantially unchanged. In this embodiment shown, the S/D regions of the fins 106n are recessed to a level below the top surface of the isolation structure 104. The channel regions of the fins 106n, covered by the gate stack 108n (FIG. 3), are not etched by operation 210. The etching process may be a dry etching process, a wet etching process, or other etching techniques. Operation 210 forms four trenches 118 with two on each side of the gate stack 108n. Each trench 118 has a tapered cross-sectional profile (in the "x-z" plane) with a wider opening at its bottom than at its top. Although not shown, each trench 118 has a rectangular shape from a top view (in the "x-y" plane). After the etching process, a cleaning process may be performed that cleans the trenches 118 with a hydrofluoric acid (HF) solution, a diluted HF solution, or other suitable cleaning solutions.

Figure 9:
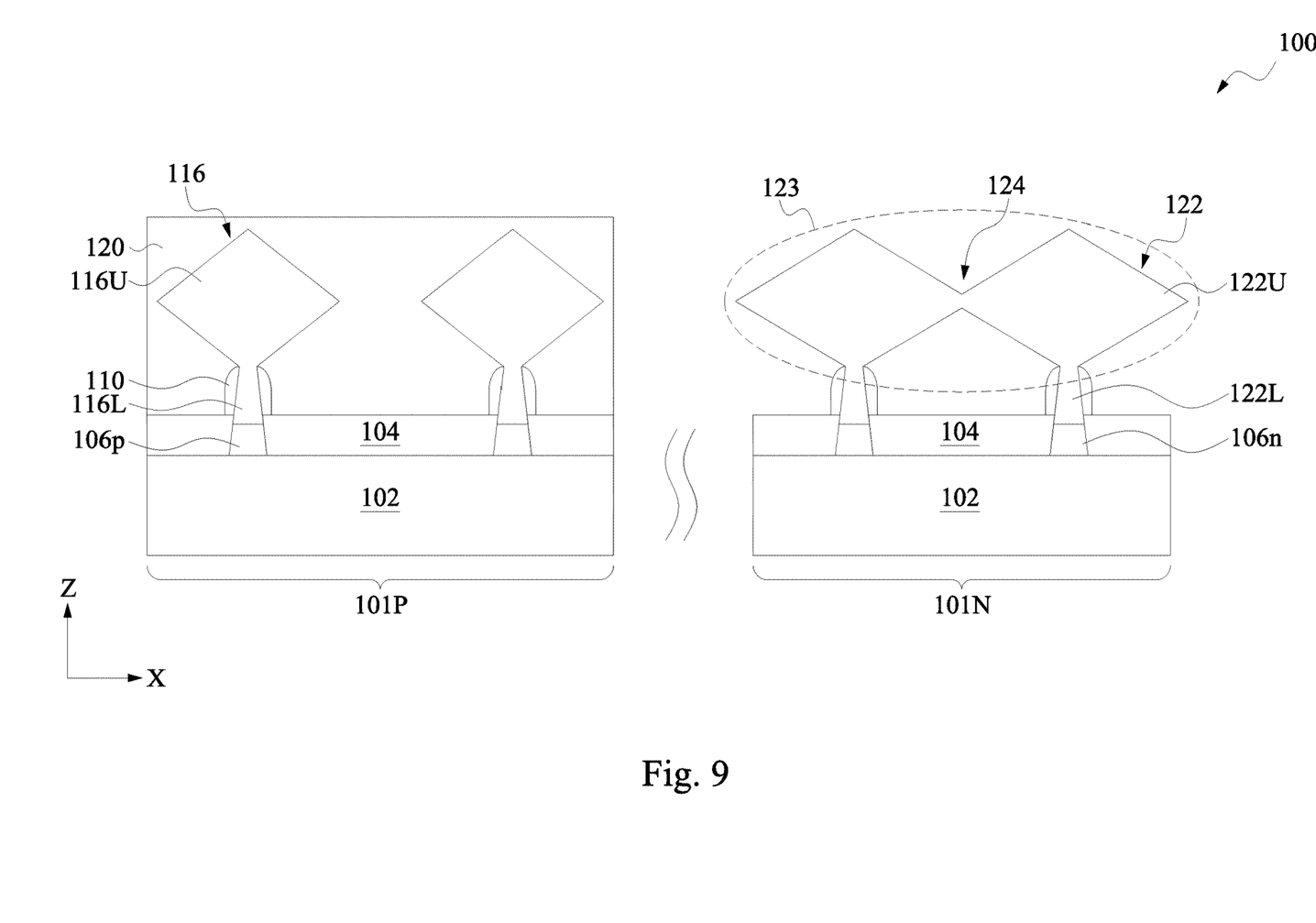
Figure 10A:
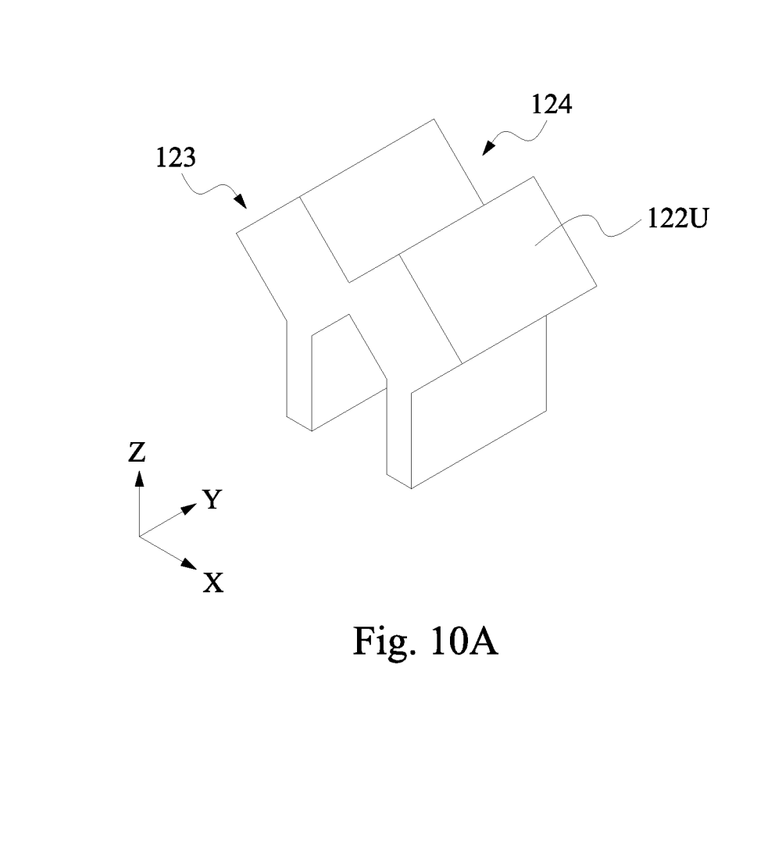
FIGS. 10A, 10B, and 10C illustrate some configurations of S/D features formed with the method of FIG. 2, in accordance with some embodiments.
Figure 10B:
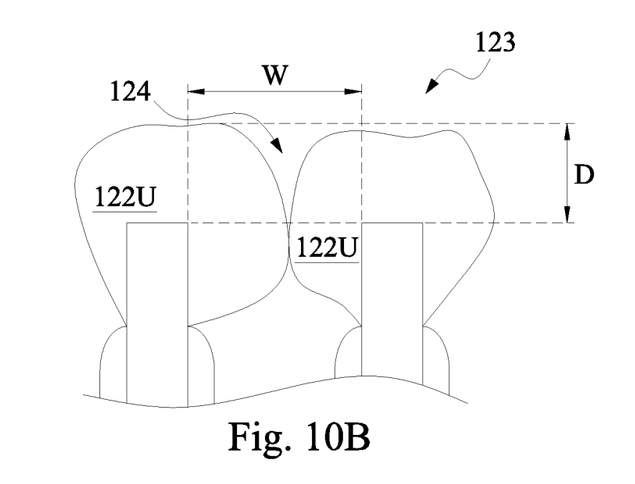
Figure 10C:
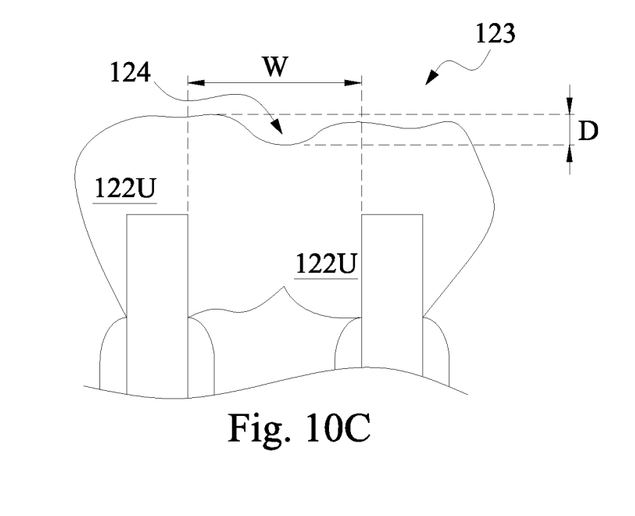

At operation 212, the method 200 (FIG. 2) grows four N-type doped S/D features 122 in the four trenches 118, with one in each trench. Referring to FIG. 9, each of the S/D features 122 includes a lower portion 122L and an upper portion 122U over the lower portion 122L. The lower portion 122L fills the trench 118 and thereby conforms to the shape of the trench 118 (FIG. 8). The upper portion 122U is above the dielectric layer 110 and expands laterally and upwardly. In this embodiment, the upper portion 122U has a generally diamond shape in the "x-z" plane. Furthermore, each two upper portions 122U on the same side of the gate stack 108n (FIG. 3) merge into a merged S/D feature 123. The merging of the S/D features 122 may be controlled by the spacing of the trenches 118 (FIG. 8), the height of the dielectric layer 110, the crystalline facets of the S/D features 122, and the growth rate and growth time for the S/D features 122. In this embodiment, the merging of the S/D features 122 is desired because it provides a larger surface area for S/D contact formation, thereby reducing S/D contact resistance. Still further, the growth time for the S/D features 122 is controlled such that the merged S/D feature 123 is provided with a curvy top surface 124. If the S/D features 122 are over-grown, the merged S/D feature 123 might be provided with a flat top surface. The curvy top surface 124 provides a larger surface area for S/D contact formation than that would be provided by a flat top surface. FIGS. 10A, 10B, and 10C illustrate some embodiments of the merged S/D feature 123.

Referring to FIG. 10A, the curvy top surface 124 includes a dip at a center of the merged S/D feature 123. In this embodiment, the center of the merged S/D feature 123 is a center line oriented along the "y" direction, parallel to the ridges of the diamond-shaped S/D features 122U. Referring to FIGS. 10B and 10C, the curvy top surface 124 includes a dip proximate the center of the two upper portions 122U which may be of a regular or irregular shape. In an embodiment, the depth of the dip, "D," is in a range from 5 nanometer (nm) to 20 nm, and the width of the dip, "W," is in a range from 10 nm to 50 nm. As discussed above, the dimension of the dip (D and W) may be controlled during the epitaxial growth process.

In an embodiment, the S/D features 122 include silicon formed by one or more epitaxial growth processes. The epitaxial growth process may be a low pressure chemical vapor deposition (LPCVD) process or a selective epitaxy growth (SEG) process. Furthermore, the one or more epitaxial growth processes may in-situ dope the grown silicon with an N-type dopant such as phosphorus, or arsenic, or combinations thereof for forming doped silicon features for N-type devices.

At operation 214, the method 200 (FIG. 2) proceeds to other steps to complete the fabrication of the device 100. In one example, the method 200 forms S/D contacts (or plugs) over the S/D features 116 and 123 using various etching and deposition processes. For example, the method 200 removes the masking element 120 (FIG. 9) using an etching process or a striping process. It then deposits an etch stop layer covering the gate stacks 108p and 108n, the S/D features 116 and 122, and the isolation structure 104. The etch stop layer may comprise silicon nitride in an embodiment, and may be deposited using ALD, CVD, or other suitable methods. The method 200 then deposits an inter-layer dielectric (ILD) layer over the etch stop layer, using PECVD, flowable CVD, or other suitable methods. The ILD layer may include materials such as tetraethylorthosilicate oxide, un-doped silicate glass, or doped silicon oxide such as borophosphosilicate glass, fused silica glass, phosphosilicate glass, boron doped silicon glass, and/or other suitable dielectric materials. The method 200 may then proceed to etching contact holes through the ILD layer and the etch stop layer to expose top surfaces of the S/D features 116 and 123. The method 200 then forms S/D contacts in the contact holes. The S/D contacts may comprise tungsten (W), cobalt (Co), copper (Cu), or any other elemental metals, metal nitrides, or combinations thereof, and may be formed by CVD, PVD, plating, and/or other suitable processes. The merged S/D features 123 advantageously provide large surface areas for the S/D contacts due to the curvy top surface 124. In an embodiment, the method 200 may form silicidation or germanosilicidation features between the S/D contacts and the S/D features 116 and 123.

In an embodiment where the gate stacks 108p and 108n are placeholders (dummy gates) for final gate stacks, the method 200 further performs a replacement gate process that replace the gate stacks 108p and 108n with final gate stacks respectively. The replacement gate process may include etching and removing the gate stacks 108p and 108n, and depositing layers of a metal gate that engage the channel regions of the fins 106p and 106n. In one example, the metal gate includes an interfacial layer, a gate dielectric layer, a work function metal layer, and a metal fill layer. The interfacial layer may include a dielectric material such as silicon oxide ($SiO_2$) or silicon oxynitride (SiON), and may be formed by chemical oxidation, thermal oxidation, ALD, CVD, and/or other suitable techniques. The gate dielectric layer may include a high-k dielectric layer such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof. The gate dielectric layer may be formed by ALD and/or other suitable methods. The work function metal layer may be a p-type or an n-type work function layer. The p-type work function layer may comprise titanium nitride (TiN), tantalum nitride (TaN), ruthenium (Ru), molybdenum (Mo), tungsten (W), platinum (Pt), or combinations thereof. The n-type work function layer may comprise titanium (Ti), aluminum (Al), tantalum carbide (TaC), tantalum carbide nitride (TaCN), tantalum silicon nitride (TaSiN), or combinations thereof. The work function metal layer may include a plurality of layers and may be deposited by CVD, PVD, and/or other suitable process. The metal fill layer may include aluminum (Al), tungsten (W), cobalt (Co), copper (Cu), and/or other suitable materials. The metal fill layer may be formed by CVD, PVD, plating, and/or other suitable processes. During the various etching, cleaning, and depositing operations in the replacement gate process, the dielectric layer 110 at the foot of the gate stacks 108p and 108n (FIG. 5B) might be over-etched, causing metal materials of the final gate stacks to leak into the S/D regions. In the present embodiment, the dielectric layer 110 on sidewalls of the S/D features 116 and 122 protect the respective S/D features from being contaminated by the leaked metal materials.

Although not intended to be limiting, one or more embodiments of the present disclosure provide many benefits to a semiconductor device and the formation thereof. For example, epitaxial features can be selectively grown in P-type and/or N-type device regions and be selectively merged into a larger S/D epitaxial feature having a curvy top surface. The curvy top surface provides a larger area for S/D contact formation, thereby reducing S/D contact resistance. Furthermore, the epitaxial features are surrounded by a dielectric layer at their bottom portions. The dielectric layer protects the epitaxial features from potential contamination due to metal extrusion. Still further, embodiments of the present disclosure can be integrated into existing fabrication flow.

In one exemplary aspect, the present disclosure is directed to a method of forming a semiconductor device. The method includes providing a precursor. The precursor includes a substrate; an isolation structure over the substrate; and two fins extending from the substrate and through the isolation structure. The two fins are disposed side-by-side. Each of the two fins has a channel region and two source/drain (S/D) regions sandwiching the channel region. The precursor further includes a gate stack over the isolation structure and engaging the channel regions of the two fins. The method further includes forming a dielectric layer on sidewalls of the S/D regions of the two fins; etching the S/D regions of the two fins, thereby forming four trenches; and growing four S/D features in the four trenches respectively. Each of the four S/D features includes a lower portion and an upper portion over the lower portion. The lower portions of the four S/D features are surrounded at least partially by the dielectric layer. The upper portions of the four S/D features merge into two merged S/D features with one on each side of the gate stack. Each of the two merged S/D features has a curvy top surface.

In another exemplary aspect, the present disclosure is directed to method of forming a semiconductor device. The method includes providing a precursor. The precursor includes a substrate; an isolation structure over the substrate; two first fins in a P-type region of the semiconductor device; and two second fins in an N-type region of the semiconductor device. The two first fins and the two second fins extend from the substrate and through the isolation structure. The two first fins are disposed side-by-side, the two second fins are disposed side-by-side, and each of the two first fins and the two second fins has a channel region and two source/drain (S/D) regions sandwiching the channel region. The precursor further includes first and second gate stacks over the isolation structure, wherein the first gate stack engages the channel regions of the two first fins, and the second gate stack engages the channel regions of the two second fins. The method further includes forming a dielectric layer on sidewalls of the first and second gate stacks and on sidewalls of the S/D regions of the two first fins and the two second fins. The method further includes etching the S/D regions of the two first fins to form four first trenches, and growing four first S/D features in the four first trenches respectively. The method further includes etching the S/D regions of the two second fins to form four second trenches, and growing four second S/D features in the four second trenches respectively. Each of the four first S/D features and the four second S/D features includes a lower portion and an upper portion over the lower portion. The lower portions of the four first S/D features and the four second S/D features are surrounded at least partially by the dielectric layer. The upper portions of the four second S/D features merge into two merged second S/D features with one on each side of the second gate stack. Each of the two merged second S/D features has a curvy top surface.

In another exemplary aspect, the present disclosure is directed to a semiconductor device. The semiconductor device comprises a substrate; an isolation structure over the substrate; two first fins in a P-type region of the semiconductor device; and two second fins in an N-type region of the semiconductor device. The two first fins and the two second fins extend from the substrate and through the isolation structure. The two first fins are disposed side-by-side, the two second fins are disposed side-by-side, and each of the two first fins and the two second fins has a channel region and two source/drain (S/D) regions sandwiching the channel region. The semiconductor device further comprises first and second gate stacks over the isolation structure. The first gate stack engages the channel regions of the two first fins. The second gate stack engages the channel regions of the two second fins. The semiconductor device further comprises a dielectric layer disposed over the isolation structure and adjacent to the S/D regions of the two first fins and the two second fins. The semiconductor device further comprises four first S/D features over the S/D regions of the two first fins; and four second S/D features over the S/D regions of the two second fins. Each of the four first S/D features and the four second S/D features includes a lower portion and an upper portion over the lower portion. The lower portions of the four first S/D features and the four second S/D features are surrounded at least partially by the dielectric layer. The upper portions of the four second S/D features merge into two merged second S/D features with one on each side of the second gate stack. Each of the two merged second S/D features has a curvy top surface.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   an isolation structure over the substrate;
   two fins in a first region of the semiconductor device, wherein the two fins extend from the substrate and through the isolation structure, and each of the two fins has a channel region and two source/drain (S/D) regions sandwiching the channel region;
   a gate stack over the isolation structure and engaging the channel regions of the two fins;
   four S/D features over the S/D regions of the two fins; and
   a dielectric layer disposed over the isolation structure and on sidewalls of the four S/D features,
   wherein:
   each of the four S/D features includes a lower portion and an upper portion over the lower portion;
   each of the lower portions of the four S/D features has a cross-sectional profile that is wider at its bottom than at its top; and
   the upper portions of the four S/D features merge into two merged S/D features with one on each side of the gate stack.

2. The semiconductor device of claim 1, wherein each of the two merged S/D features has a curvy top surface.

3. The semiconductor device of claim 2, wherein the curvy top surface includes a dip proximate to a center of the curvy top surface.

4. The semiconductor device of claim 3, wherein the dip has a depth ranging from 5 nanometers (nm) to 20 nm and a top opening ranging from 10 nm to 50 nm.

5. The semiconductor device of claim 1, wherein the dielectric layer is directly underneath the upper portions of the four S/D features.

6. The semiconductor device of claim 1, wherein each of the four S/D features includes n-type doped silicon.

7. The semiconductor device of claim 1, wherein each of the upper portions of the four S/D features has a larger area than the respective lower portion from a top view.

8. The semiconductor device of claim 1, further comprising:
   two second fins in a second region of the semiconductor device, wherein the two second fins extend from the substrate and through the isolation structure, and each of the two second fins has a channel region and two source/drain (S/D) regions sandwiching the respective channel region;
   a second gate stack over the isolation structure and engaging the channel regions of the two second fins; and
   four second S/D features over the S/D regions of the two second fins, wherein the four second S/D features are separate from each other.

9. The semiconductor device of claim 8, wherein each of the four S/D features includes n-type doped silicon and each of the four second S/D features includes p-type doped silicon germanium.

10. The semiconductor device of claim 8, wherein the dielectric layer is in physical contact with each of the four S/D features and the four second S/D features.

11. The semiconductor device of claim 1, wherein each of the upper portions of the four S/D features has a generally diamond shape in a cross-sectional view.

12. A semiconductor device, comprising:
a substrate;
an isolation structure over the substrate;
two fins in an N-type region of the semiconductor device, wherein the two fins extend from the substrate and through the isolation structure, and each of the two fins has a channel region and two source/drain (S/D) regions sandwiching the channel region;
a gate stack over the isolation structure and engaging the channel regions of the two fins;
four S/D features over the S/D regions of the two fins; and
a dielectric layer disposed over the isolation structure and on sidewalls of the four S/D features, wherein:
an upper portion of the dielectric layer has a width larger than that of a lower portion of the dielectric layer;
each of the four S/D features includes a lower portion and an upper portion over the lower portion;
each of the lower portions of the four S/D features has a cross-sectional profile that is wider at its bottom than at its top;
the upper portions of the four S/D features are above the dielectric layer and merge into two merged S/D features with one on each side of the gate stack; and
each of the two merged S/D features has a curvy top surface.

13. The semiconductor device of claim 12, wherein the lower portions of the four S/D features extend below a top surface of the isolation structure.

14. The semiconductor device of claim 12, wherein the curvy top surface includes two peaks and a dip between the two peaks in a cross-sectional view.

15. The semiconductor device of claim 14, wherein a depth of the dip ranges from 5 nanometers (nm) to 20 nm and a distance between the two peaks ranges from 10 nm to 50 nm in the cross-sectional view.

16. The semiconductor device of claim 12, wherein the upper portions of the four S/D features include an n-type dopant.

17. A semiconductor device, comprising:
a substrate;
an isolation structure over the substrate;
two fins in an N-type region of the semiconductor device, wherein the two fins extend from the substrate and through the isolation structure, the two fins are disposed side-by-side, and each of the two fins has a channel region and two source/drain (S/D) regions sandwiching the channel region;
a gate stack over the isolation structure and engaging the channel regions of the two fins;
a dielectric layer disposed over the isolation structure and adjacent to the S/D regions of the two fins; and
four S/D features over the S/D regions of the two fins, wherein:
each of the four S/D features includes a lower portion and an upper portion over the lower portion;
the lower portions of the four S/D features are surrounded at least partially by the dielectric layer;
the dielectric layer has a straight sidewall directly facing the lower portions of the four S/D features and a curvy sidewall opposing the straight sidewall;
each of the lower portions of the four S/D features has a cross-sectional profile that is wider at its bottom than at its top;
the upper portions of the four S/D features merge into two merged S/D features with one on each side of the gate stack; and
each of the two merged S/D features has a curvy top surface.

18. The semiconductor device of claim 17, further comprising:
two second fins in a P-type region of the semiconductor device, wherein the two second fins extend from the substrate and through the isolation structure, the two second fins are disposed side-by-side, and each of the two second fins has a channel region and two S/D regions sandwiching the respective channel region;
a second gate stack over the isolation structure and engaging the channel regions of the two second fins; and
four second S/D features over the S/D regions of the two second fins, wherein upper portions of the four second S/D features are physically separate from each other.

19. The semiconductor device of claim 18, wherein each of the upper portions of the four second S/D features is in a generally diamond shape in a cross-sectional view.

20. The semiconductor device of claim 17, wherein the curvy top surface has a dip of 5 to 20 nm proximate a center of the curvy top surface.

* * * * *